(12) United States Patent
Banarie et al.

(10) Patent No.: US 8,653,996 B2
(45) Date of Patent: Feb. 18, 2014

(54) STABILITY CORRECTION FOR A SHUFFLER OF A Σ-DELTA ADC

(71) Applicants: Gabriel Banarie, Murroe (IE); Adrian Sherry, Raheen (IE)

(72) Inventors: Gabriel Banarie, Murroe (IE); Adrian Sherry, Raheen (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/685,063

(22) Filed: Nov. 26, 2012

(65) Prior Publication Data

US 2013/0207819 A1  Aug. 15, 2013

Related U.S. Application Data

(60) Provisional application No. 61/597,328, filed on Feb. 10, 2012.

(51) Int. Cl.
*H03M 3/00* (2006.01)

(52) U.S. Cl.
USPC .............................. 341/143; 341/118; 341/155

(58) Field of Classification Search
USPC .......................................... 341/118, 143, 155
See application file for complete search history.

(56) References Cited

U.S. PATENT DOCUMENTS

| | | | | |
|---|---|---|---|---|
| 5,493,297 A | * | 2/1996 | Nguyen et al. | 341/118 |
| 5,815,102 A | * | 9/1998 | Melanson | 341/143 |
| 6,150,969 A | * | 11/2000 | Melanson | 341/143 |
| 6,646,581 B1 | * | 11/2003 | Huang | 341/143 |
| 2002/0190884 A1 | | 12/2002 | Yu | |
| 2007/0236377 A1 | | 10/2007 | Chen et al. | |
| 2007/0241950 A1 | | 10/2007 | Petilli et al. | |
| 2009/0262877 A1 | | 10/2009 | Shi et al. | |

OTHER PUBLICATIONS

International Search Report and Written Opinion dated Apr. 23, 2013, issued for the counterpart International Application No. PCT/US2013/025344.

* cited by examiner

*Primary Examiner* — Khai M Nguyen
(74) *Attorney, Agent, or Firm* — Kenyon & Kenyon LLP

(57) ABSTRACT

A sigma-delta analog-to-digital converter ("ΣΔ ADC") may include a loop filter, ADC, a feedback digital-to-analog converter ("DAC"), and a control circuit. The feedback DAC may include several unit elements (resistors, capacitors, or current sources) that, ideally, are identical to each other but vary due to mismatch errors introduced during manufacture. Mismatch errors may introduce signal errors that generate undesirable noise frequencies and non-linearities in a ΣΔ ADC output signal. Embodiments of the present invention provide a stability corrected second order shuffler that allows for the shaping of the frequency response by the ΣΔ ADC to reduce the effect of the mismatch error between DAC unit elements. The second order shuffler may include accumulation correctors, to suppress saturation for accumulators within the shuffler. The suppression may compress the range of accumulation values for each accumulator while maintaining context for the values to stabilize operation of the second order shuffler.

28 Claims, 4 Drawing Sheets

100

300

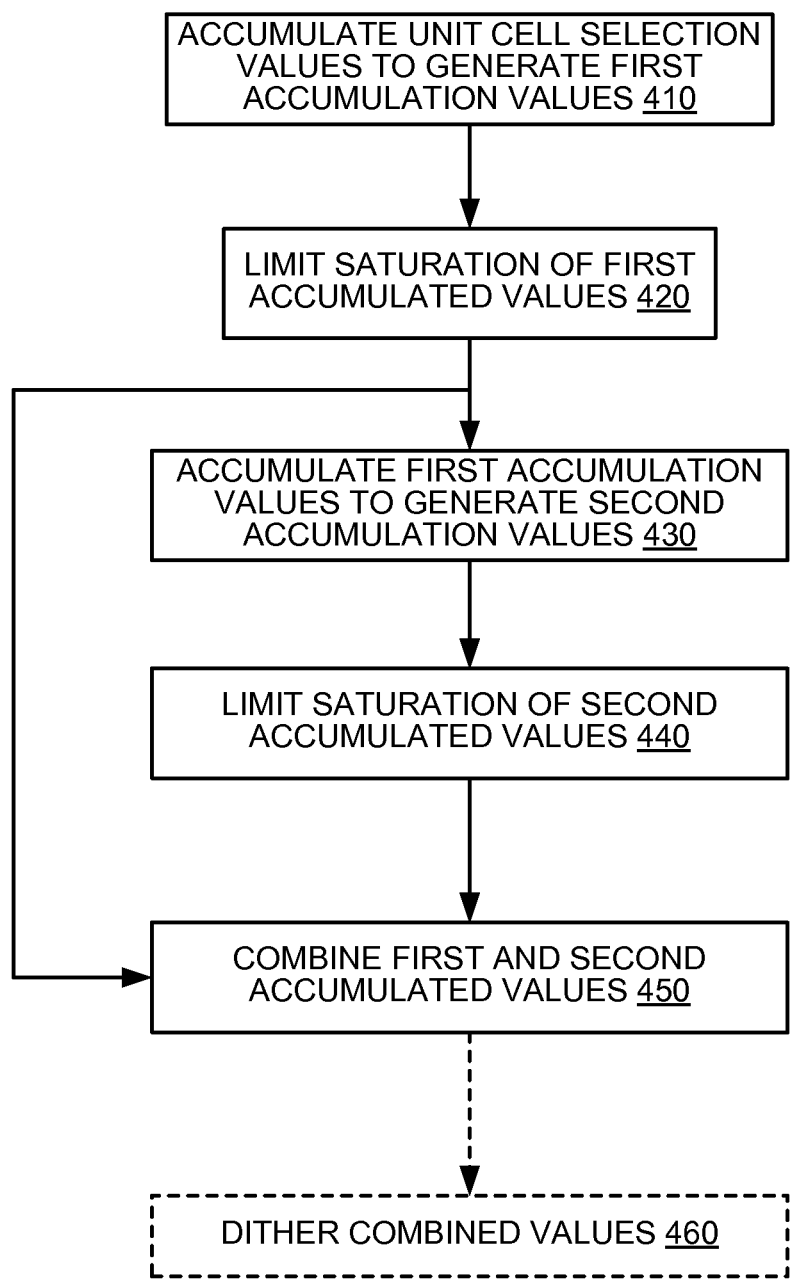

US 8,653,996 B2

STABILITY CORRECTION FOR A SHUFFLER OF A Σ-DELTA ADC

PRIORITY CLAIM

The present application claims priority to U.S. Provisional Application No. 61/597,328 filed on Feb. 10, 2012, which is incorporated by reference herein.

BACKGROUND

A sigma-delta analog-to-digital converter ("ΣΔ ADC") is an electronic device that receives an analog input signal and generates a digital representation of the input signal. Conventional ADCs perform a similar function but require high oversampling of the analog input signal or increasing the number of bits (quantization levels) in order to minimize quantization noise—a by-product of the analog-to-digital conversion process.

Sigma-delta ADCs include an error correction loop that relaxes oversampling requirements for the analog-to-digital conversion process and shapes the frequency of the quantization noise to push it out of an area (frequency) of interest. The error correction loop may include a shuffler (sometimes referred to as a scrambler or a mismatch-shaper) and a feedback digital-to-analog converter ("DAC"). The shuffler may not be required if the loop is for a single bit. The shuffler receives an ADC output signal from an internal ADC (quantizer) and generates selection signals which control charge transfer for unit elements (resistors, capacitors, or current sources) of the DAC. The DAC unit elements may introduce mismatch noise into the frequency of interest, due to mismatch errors introduced into unit elements during manufacturing. Based on the selection, the DAC generates an output signal which is subtracted from the input signal. Thus, the noise transfer function of the error correction loop performs shaping of the quantization noise for the ΣΔ ADC output signal.

The function of a shuffler is known at an academic level, however, production implementations may vary. Shufflers might be implemented using multi-order (i.e., first order, second order, etc.) frequency shaping signal processing techniques to minimize unit element mismatch noise in the frequency of interest. Increased order results in increased minimization of mismatch noise in the frequency of interest. FIG. 1 illustrates a block diagram of a possible implementation of a second order shuffler 100.

As illustrated in FIG. 1, the second order shuffler 100 includes: a sorter 110, two stages of N accumulators 120.1-120.N, 130.1-130.N, N feed forward buffers 140.1-140.N, and N adders 150.1-150.N. The shuffler 100 receives an N-valued output signal y[n] from an ADC over times 'n'. The shuffler 100 generates N selection signals $y_{Sk}[n]$, which engage unit elements within a DAC to generate an electrical charge, current or voltage in a feedback path of a ΣΔ ADC.

The sorter 110 ranks an accumulated history of unit element selection signals, labeled "$d_k[n]$," and maps the output signal y[n] to selection signals $y_{Sk}[n]$ based on the ranking. Operation of the sorter 110 can be described mathematically as an error signal $e_k[n]$ (not shown) added to the accumulated history of selection signals $d_k[n]$ to generate the selection signals $y_{Sk}[n]$. The error signal $e_k[n]$ can be seen as the difference between the accumulated history of selection signals $d_k[n]$ and the selection signals $y_{Sk}[n]$.

Each first stage accumulator 120.1-120.N performs accumulation for values of respective selection signals $y_{Sk}[n]$. An output from each first stage accumulator 120.1-120.N is labeled "$w_{1k}[n]$". Similarly, each second stage accumulator 130.1-130.N generates an output accumulation, labeled "$w_{2k}[n]$." The feed forward buffers 140.1-140.N scale the outputs of the first stage accumulators 120.1-120.N for combination with the outputs of the second stage accumulators 130.1-130.N. A scaling factor 'X' determines the weighting for the first stage accumulator 120.1-120.N outputs $w_{1k}[n]$. The shuffler 100 may include buffers 160.1-160.N to provide a negative value of the selection signals $y_{Sk}[n]$ to the first stage accumulator 120.1-120.N. In addition to the feed forward topology introduced in FIG. 1, the error feed-back topologies and signal feed-back topologies can be used to implement the transfer function of the circuit.

For a processing loop within the shuffler 100 where X=2, the various signals are represented by a system of equations as follows:

$$w_{1k}[n]=w_{1k}[n-1]-y_{Sk}[n-1]$$
$$w_{2k}[n]=w_{2k}[n-1]+w_{1k}[n-1]$$
$$d_K[n]=w_{2k}[n]+2w_{1k}[n]$$
$$y_{Sk}[n]=d_K[n]+e_K[n] \qquad \text{Eqn. 1}$$

The relationship between the ΣΔ ADC output signal y[n], which has a value between 0–N, and the N selection signals $y_{Sk}[n]$, which have values of +1 or −1 (or in alternative embodiment values −1, 0 or +1), is represented by the following equation:

$$\sum_{k=1}^{N} y_{S_k}[n] = 2y[n] - N \qquad \text{Eqn. 2}$$

A Z transform of the selection signal, which illustrates the second order shaping of the error signal is expressed as:

$$Y_{S_k}(z)=(1-z^{-1})^2 \cdot E_k(z) \qquad \text{Eqn. 3}$$

The second order shuffler 100, however, may become unstable when signals input to the accumulator stages 120.1-120.N, 130.1-130.N are not zero-mean, which is the case for shufflers used in ΣΔ ADCs. When the input signals are not zero mean, the accumulators 120.1-120.N, 130.1-130.N might accumulate in an unbounded manner and need to be saturated at upper and lower bounds. The saturation, in effect, limits the frequency shaping function of the shuffler 100 to first-order frequency shaping. First order frequency shaping can degrade SNR for the ΣΔ ADC output signal y[t].

Accordingly, a need in the art exists for a stable second order shuffler for a ΣΔ ADC.

BRIEF DESCRIPTION OF THE DRAWINGS

FIG. 4 illustrates a method for correcting stability of a second order shuffler according to an embodiment of the present invention.

DETAILED DESCRIPTION

A multi-bit sigma-delta analog-to-digital converter ("ΣΔ ADC") may include a loop filter, an ADC, a feedback digitalto-analog converter ("DAC"), and a control circuit. The feedback DAC may include several unit elements (resistors, capacitors, or current sources) that, ideally, are identical to each other but vary due to mismatch errors introduced during manufacture. Mismatch errors may introduce signal errors that generate undesirable noise frequencies and non-linearities in a ΣΔ ADC output signal. Embodiments of the present invention provide a stable second order shuffler that allows for shaping of the frequency response by the ΣΔ ADC to reduce the effect of the mismatch error between DAC unit elements. The second order shuffler may compensate for mismatch errors between the DAC unit elements and may shape the frequency response of the errors as manifested in the ΣΔ ADC output signal. Compensation for the mismatch errors within the DAC unit elements may minimize noise within a frequency of interest for the ΣΔ ADC and may improve the signal-to-noise ratio ("SNR") of the ΣΔ ADC output signal within a frequency of interest. The second order shuffler may include accumulation correctors, which may suppress saturation for accumulators within the shuffler. The suppression may compress the range of accumulation values for the accumulators while maintaining context for the values to stabilize operation of the second order shuffler.

Figure 1:
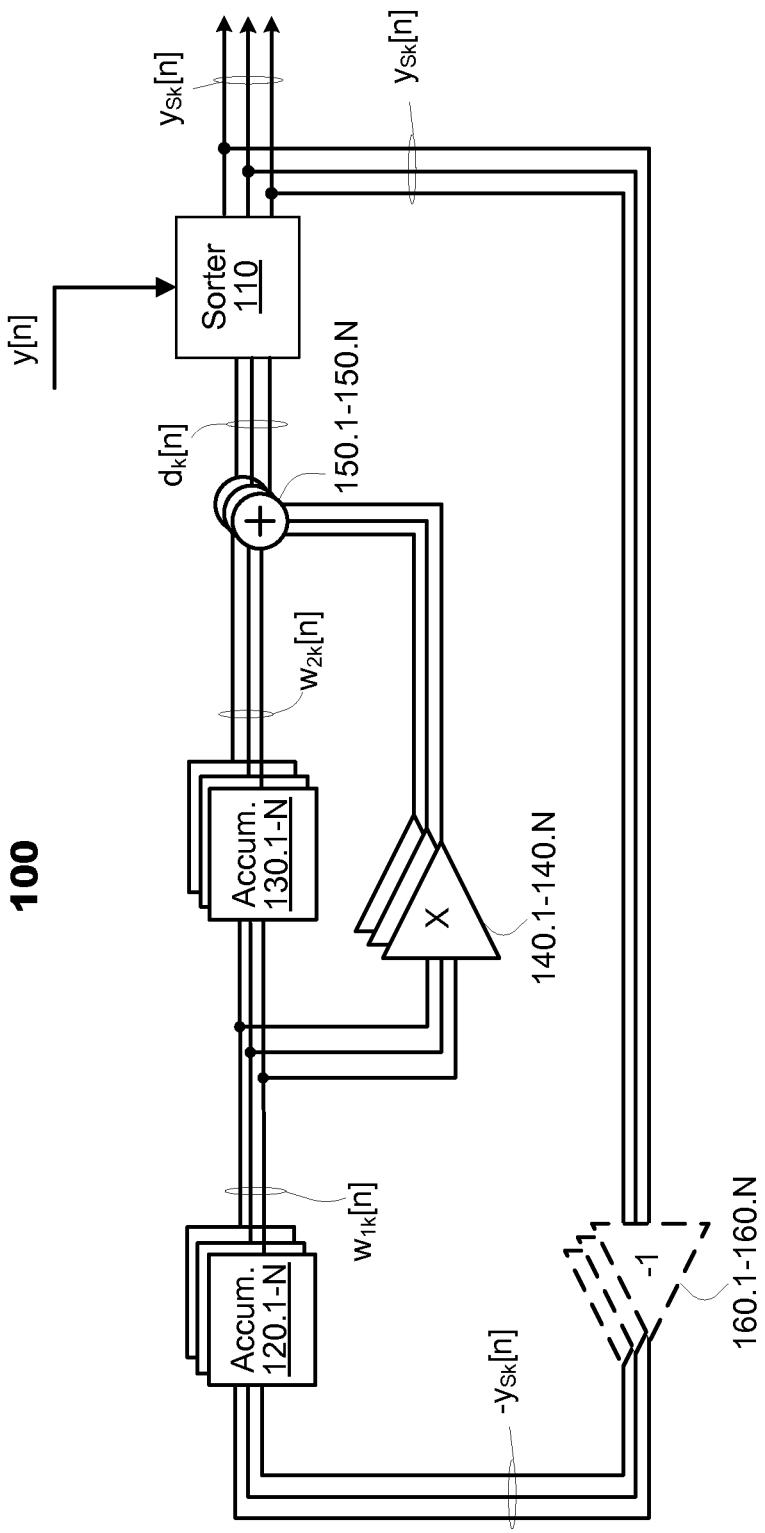
FIG. 1 illustrates a block diagram of one type of second order shuffler.
Figure 2:
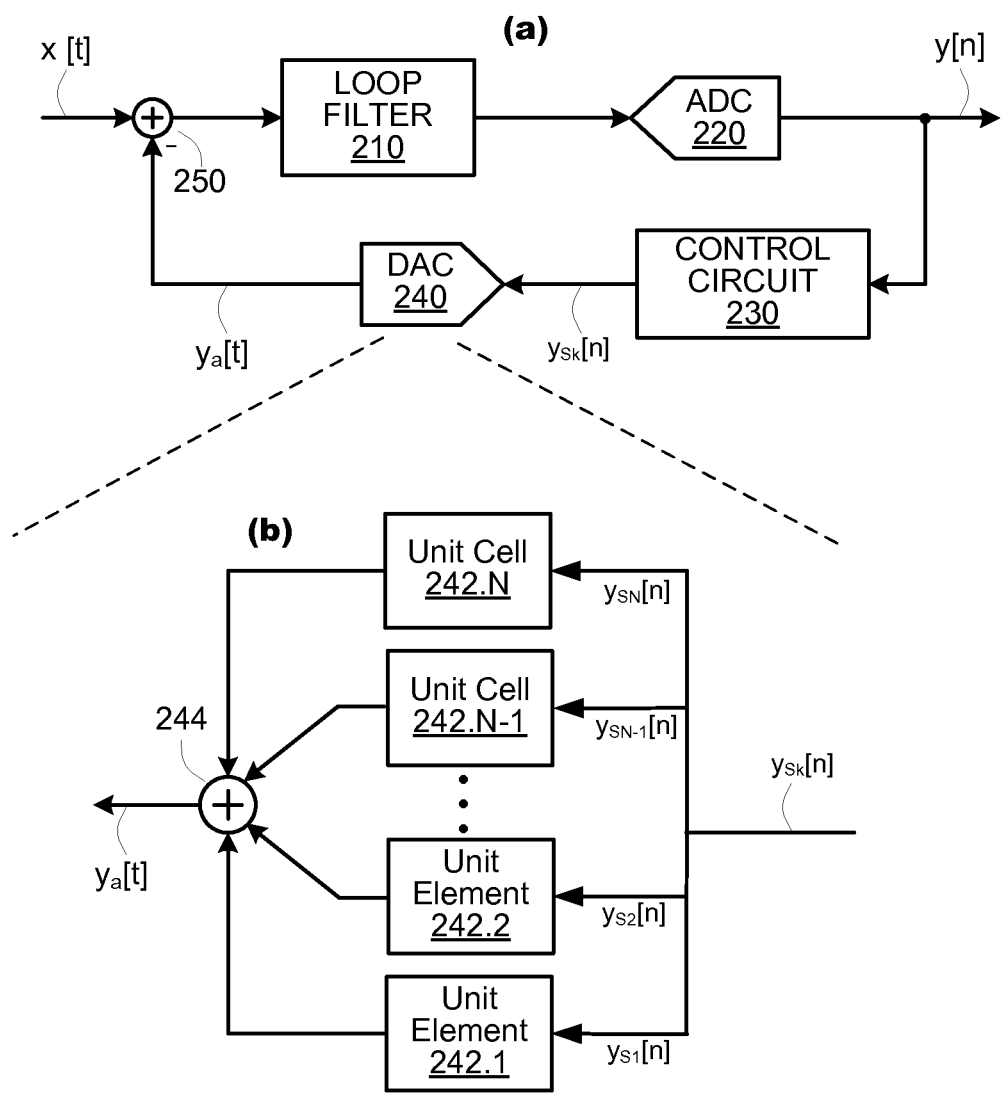
FIG. 2 illustrates a second order ΣΔ ADC according to an embodiment of the present invention.

FIG. 2(a) illustrates a ΣΔ ADC 200 according to an embodiment of the present invention. As illustrated in FIG. 2(a), the ΣΔ ADC 200 may include: a loop filter 210, an ADC 220, a control circuit 230, a feedback DAC 240 and a subtractor 250. The ΣΔ ADC 200 may receive an analog input signal x[t] over time t and generate an N-valued digital output signal y[n] over discrete times 'n'. Resolution of the output signal y[n] may be determined by the resolution of the ADC 220.

During operation, the subtractor 250 may subtract from the input signal x[t] a feedback signal, labeled "$y_a[t]$." The feedback signal $y_a[t]$ may be an analog representation of the output signal y[n] that may include errors induced by unit elements of the DAC 240. An output signal from the subtractor 250 may be filtered by the loop filter 210, which may effectively perform at least one integration on the signal output from the subtractor 250. An output from the loop filter 210 may be fed to the ADC 220. The ADC 220 may generate the output signal y[n], a digital representation of the input signal x[t] which may include shaped quantization noise.

The output signal y[n] may be input to the control circuit 230, which may generate N selection signals, labeled "$y_{Sk}[n]$," for engaging unit elements within the DAC 240. FIG. 2(b) schematically illustrates a plurality of unit elements 242.1-242.N that may form the DAC 240. The DAC 240 may engage unit elements 242.1-242.N to generate an output charge, current or voltage as determined by respective selection signals $y_{Sk}[n]$. The output of each engaged unit element 242.1-242.N may be combined by an adder, shown here as adder 244, to generate the feedback signal $y_a[t]$, which may be input to the subtractor 250.

In various embodiments, the unit elements 242.1-242.N may be capacitors, resistors, current sources, or other device capable of generating an output charge, current or voltage. For ease of discussion, the selection signals $y_{Sk}[n]$ are described as having values of +1 or −1 or values of −1, 0, or 1, which determine how associated DAC unit elements 241.1-242.N contribute, in aggregate, to the feedback signal $y_a[t]$.

Although the unit elements 242.1-242.N, ideally, are identical, due to manufacturing process errors, they may not be exactly matched. Mismatch of the unit elements 242.1-242.N may induce non-linear errors on the feedback signal $y_a[t]$, which may degrade SNR for the output signal y[n] and affect linearity. For example, the charge, voltage or current produced by the DAC may not be linearly dependent on the number of elements selected (e.g., selecting two elements may not produce voltage, current or charge that is twice the value when one element is selected). The control circuit 230 may generate the selection signals $y_{Sk}[n]$ to compensate for mismatch errors within the unit elements 242.1-242.N, which, in turn, may frequency shape mismatch noise for the output signal y[n]. A designer may optimize the mismatch noise frequency shaping based on a desired oversampling rate for the ADC 220 and the expected mismatch errors of the unit elements 242.1-242.N. In an embodiment, the control circuit 230 may be implemented as a stability corrected multi-order shuffler (e.g., second order shuffler).

Figure 3:
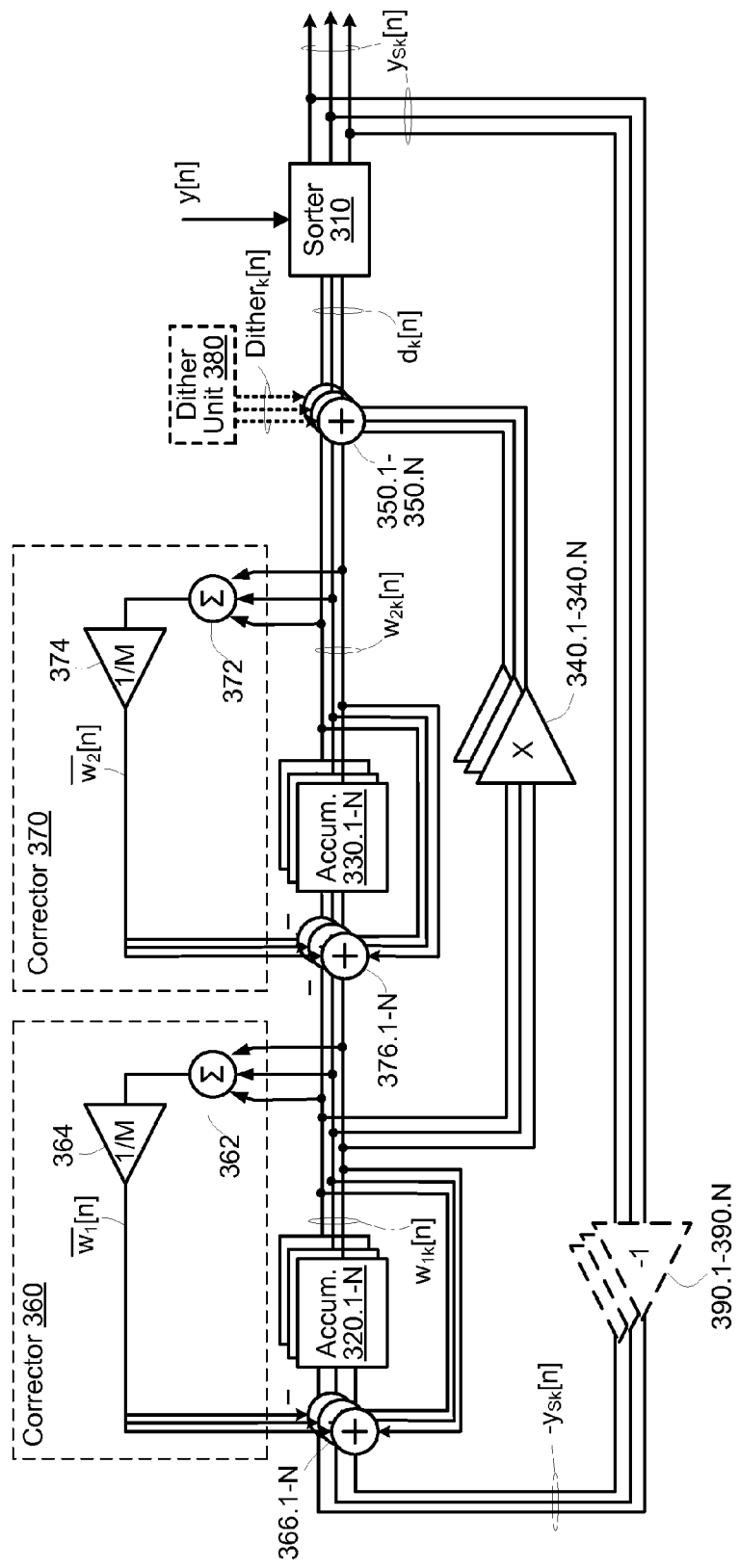
FIG. 3 illustrates a stability corrected second order shuffler according to an embodiment of the present invention.

FIG. 3 illustrates a stability corrected second order shuffler 300 according to an embodiment of the present invention. The stability corrected second order shuffler 300 may avoid saturation and/or overflow of accumulators that leads to the instability as noted above. As illustrated in FIG. 3, the stability corrected second order shuffler 300 may include: a sorter 310, a first set of accumulators 320.1-320.N, a second set of accumulators 330.1-330.N, a set of feed-forward buffers 340.1-340.N, a set of adders 350.1-350.N, and a pair of correctors 360, 370. The shuffler 300 may receive a ΣΔ ADC (not shown) multi-valued output signal y[n] (e.g., N+1 values: 0, 1, 2, ... N). The shuffler 300 may generate N selection signals $y_{Sk}[n]$ which may engage DAC unit elements (e.g., DAC unit elements 242.1-242.N of FIG. 2(b)) to generate corresponding output charges, currents or voltages. The shuffler 300 may include buffers 390.1-390.N to provide a negative value of the selection signals $y_{Sk}[n]$ to the first stage accumulator 320.1-320.N (e.g., via the set of adders and/or subtractors 366.1-366.N).

The sorter 310 may rank an accumulated history of unit element selection signals $d_k[n]$ based on the output signal y[n]. The sorter 310 may engage DAC unit elements based on a ranking of the accumulated history of selection signals $d_k[n]$ in relation to the ADC output signal y[n].

A first accumulator set 320.1-320.N may calculate an integration history for each value of the selection signal $y_{Sk}[n]$ to generate an output signal, labeled "$w_{1k}[n]$," where k may represent a unit element number 1-N within the DAC. A second accumulator set 330.1-330.N may calculate second integration history for each value of the first accumulator output signal $w_{1k}[n]$ to generate an output signal, labeled "$w_{2k}[n]$," for each unit element. The feed-forward buffers 340.1-340.N may scale the outputs of the first accumulators 320.1-320.N for combination with the outputs of the second accumulators 330.1-330.N. A scaling factor 'X' may determine the weighting for the first accumulator 320.1-320.N outputs $w_{1k}[n]$. The adders 350.1-350.N may combine the output signals from the accumulators 320.1-320.N, 330.1-330.N to generate the accumulated history of unit element selection signals $d_k[n]$.

A first corrector 360 may provide stability correction for the first accumulators 320.1-320.N by minimizing an integration history of each accumulator toward zero, thus, suppressing saturation for the first accumulators 320.1-320.N. A second corrector 370 may provide stability correction for the second accumulator set 330.1-330.N in a similar manner.

The first corrector 360 may include an adder 362, a divider 364, and a set of adders and/or subtractors 366.1-366.N. During operation, the adder 362 may combine each output signal $w_{1k}[n]$ of the first accumulator 320.1-320.N to calculate a sum of the signals. The divider 364 may divide the sum by a correction factor M to generate an output signal $\overline{w}_1[n]$. For common mode stability (e.g., common mode of the accumulators may represent the average value), the correction factor M may be greater than N. The output (e.g., $\overline{w}_1[n-1]$) of the first corrector 360 may be combined with the sum of corresponding outputs (e.g., $w_{1k}[n-1]$) of the first accumulator 320.1-320.N and the next selection signals (e.g., $-y_{sk}[n]$). For example, the set of adders and/or subtractors 366.1-366.N may add prior outputs ($w_{1k}[n-1]$) of the first accumulator 320.1-320.N, the negative value of the current selection signal ($-y_{sk}[n]$) and the negative value of the prior output ($-\overline{w}_1[n-1]$) of the first corrector 360. An output from each set of adders and/or subtractors 366.1-366.N may be fed to the accumulator set 320.1-320.N to update the integration history of each accumulator 320.1-320.N. The output from the first corrector 360 and the first accumulator 320.1-320.N may be delayed a clock cycle by clock delays (not shown) provided in the first corrector 360 or the accumulator set 320.1-320.N.

The second corrector 370 also may include an adder 372, a divider 374, and a set of adders and/or subtractors 376.1-376.N. During operation, the adder 372 may combine each output signal $w_{2k}[n]$ of each accumulator 330.1-330.N to compute a sum of the signals. The divider 374 may divide the sum by a correction factor M to generate an output signal $\overline{w}_2[n]$. The output (e.g., $\overline{w}_2[n-1]$) of the second corrector 370 may be combined to each sum of corresponding outputs (e.g., $w_{2k}[n-1]$) of the second accumulator 330.1-330.N and the outputs (e.g., $w_{1k}[n]$) of the first accumulator 320.1-320.N. For example, the set of adders and/or subtractors 376.1-376.N may add prior outputs ($w_{2k}[n-1]$) of the second accumulator 330.1-330.N, the negative value of the current outputs ($-w_{1k}[n]$) of the first accumulator 320.1-320.N and negative value the prior output of the second corrector 370 ($-\overline{w}_2[n-1]$). An output from each set of adders and/or subtractors 376.1-376.N may be fed to the accumulator set 330.1-330.N to update the integration history of each accumulator 330.1-330.N. The output of the second corrector 370 and the second accumulator 330.1-330.N may be delayed a clock cycle by clock delays (not shown) provided in the second corrector 370 or the accumulator set 330.1-330.N.

The adders and/or subtractors 366.1-366.N and the adders and/or subtractors 376.1-376.N may be implemented as only adders or only subtractors. In such a case, additional buffers may be included to provide a negative value of the appropriate signals (e.g., output outputs $w_{1k}[n]$ of the first accumulator 320.1-320.N, output $\overline{w}_1[n]$ of the first corrector 360, and/or output $\overline{w}_2[n]$ of the second corrector 370).

By suppressing saturation for the integration histories of the accumulators 320.1-320.N, 330.1-330.N, the corresponding correctors 360, 370 may eliminate or reduce the need for the system to saturate the accumulators during operation. Thus, allowing the mismatch shaping to stay second order. By way of example, in the case of the ADC 220 output being kept at a constant output 'F' with 0≤F≤N, and F≠N/2, the stability corrected common mode output for each output signal may be expressed as follows:

$$\overline{w}_1[n] = -(M - (M-N)\alpha^{n-1})\left(\frac{2F}{N} - 1\right) \quad \text{Eqn. 4}$$

$$\overline{w}_2[n] = -\left(1 - \frac{\alpha}{(1-\alpha)^2}\alpha^{n-2} - \frac{n-1}{1-\alpha}\alpha^{n-1}\right)\left(\frac{2F}{N} - 1\right) \quad \text{Eqn. 5}$$

The term 'α' is equal to 1−N/M. The common mode output $\overline{w}_1[n]$ is valid for n≥1, while the common mode output $\overline{w}_2[n]$ is valid for n≥2 (to allow integration histories to accumulate for each accumulator set 320.1-320.N, 330.1-330.N). In an embodiment, M may be selected as a power of 2; in this case, the dividers 364, 374 may be implemented by truncating the outputs from respective adders 362, 372 by a corresponding number of bits.

In an embodiment, the shuffler 300 may include a dither unit 380 to generate N dither signals $Dither_k[n]$. The dither signals $Dither_k[n]$ may be coupled to corresponding adders 350.1-350.N for dithering the combined accumulator output signals. The dither signals $Dither_k[n]$ may introduce randomization (e.g., pseudo random number scheme) into the combined accumulator output signals. In effect, the dithering may minimize the likelihood of the shuffler 300 settling into repeating unit element selection patterns that may be observable in the output signal y[n].

FIG. 4 illustrates a method 400 for providing stability correction for a second order shuffler according to an embodiment of the present invention. As illustrated in FIG. 4, the method 400 may accumulate each of a plurality of selection values to generate first accumulation values for each unit element selection value (block 410). The unit element selection values may represent a value for an output signal that DAC unit elements may generate. At block 420, the method 400 may limit saturation for each first accumulation value. The limiting may compress a range for each first accumulation value while maintaining context for each range. At block 430, the method 400 may accumulate each first accumulation value to generate second accumulation values. The method 400 may limit saturation for each second accumulation value (block 440). The limiting may compress a range for each second accumulation value while maintaining context for each range. The method 400 may combine each first and second accumulation value to provide updated unit element selection values (block 450).

In an embodiment, the method 400 may dither the updated unit element selection values to minimize deterministic behavior of the method (block 460). The dithering may introduce pseudo-randomized dithering values for combination with each updated unit element selection value.

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

For example, the embodiments discussed above may be applied not only to a low-pass sigma-delta converter, but also to a high-pass sigma-delta converter or a band-pass sigma-delta converter. In such implementations, the loop filter 210 (shown in FIG. 2) may be a high-pass filter or a low pass filter to provide the appropriate frequency of interest. In addition, although the above embodiments are discussed with reference to a feed-forward topology, the principles of the above embodiments can be applied to an error feed-back topology or to a signal feed-back topology.

Furthermore, although the above embodiments are discussed with reference to a second order shuffler, the shuffler could be extended to an M-th order shuffler. For example, a third-order shuffler could be implemented by including a third set of N accumulators and a third corrector according to the above discussed embodiments.

Those skilled in the art may appreciate from the foregoing description that the present invention may be implemented in a variety of forms, and that the various embodiments may be implemented alone or in combination. The features of the disclosed embodiments may be implemented in hardware, software, firmware, or a combination thereof and utilized in systems, subsystems, components or subcomponents thereof. When implemented in software, the elements of the disclosed embodiments are programs or the code segments used to perform the necessary tasks. The program or code segments can be stored on non-transitory machine readable storage media. The "non-transitory machine readable storage media" may include any medium that can store information. Examples of a non-transitory machine readable storage medium may include electronic circuits, semiconductor memory devices, ROM, flash memory, erasable-programmable ROM (EPROM), or any electromagnetic or optical storage device. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

We claim:

1. A second order shuffler, comprising:
    a first set of N accumulators, each first accumulator to receive corresponding digital-to-analog converter (DAC) unit element selection signals, each to accumulate values representing the corresponding selection signals and to generate corresponding first accumulator output values;
    a first corrector provided for the first accumulators to compress a range of the first accumulator output values for each first accumulator while maintaining context of each first accumulator with reference to the other first accumulators;
    a second set of N accumulators, each second accumulator to receive corresponding first accumulator output values, each to accumulate the corresponding output values and to generate corresponding second accumulator output values;
    a second corrector provided for the second accumulators to compress a range of the second accumulator output values for each second accumulator while maintaining context of each second accumulator with reference to the other second accumulators; and
    a set of N adders to combine each of the first and second accumulator output values.

2. The second order shuffler of claim 1, the first corrector further comprising:
    an adder to sum each of the first accumulator output values;
    a divider to scale an output from the adder by a predetermined first correction factor; and
    a set of N subtractors, each to subtract an output from the divider from each of the first accumulator output values, wherein an output from each of the subtractors is provided to the corresponding first accumulators to determine a new first accumulator output values.

3. The second order shuffler of claim 2, wherein the first correction factor is greater than N.

4. The second order shuffler of claim 2, wherein the first divider truncates the adder output for correction factors that correspond to a power of 2.

5. The second order shuffler of claim 1, the second corrector further comprising:
    an adder to sum each of the second accumulator output values;
    a divider to scale an output from the adder by a predetermined second correction factor; and
    a set of N subtractors, each to subtract an output from the divider from each of the second accumulator output values, wherein an output from each of the subtractors is provided to the corresponding second accumulators to determine a new second accumulator output values.

6. The second order shuffler of claim 5, wherein the second correction factor is greater than N.

7. The second order shuffler of claim 5, wherein the second divider truncates the adder output for correction factors that correspond to a power of 2.

8. The second order shuffler of claim 1, further comprising:
    a dithering unit to apply pseudo-randomized dithering values to each of the combined first and second accumulator output values.

9. A sigma-delta analog-to-digital converter ("$\Sigma\Delta$ ADC"), comprising:
    a filter having an input to receive an input signal and a feedback signal;
    an ADC having an input coupled to an output of the filter;
    a digital-to-analog converter ("DAC") comprising N unit elements and an input for an N-bit selection signal that determines an orientation of contribution of the N unit elements to the feedback signal; and
    a multi-order shuffler comprising:
        a first set of N accumulators, each first accumulator having an input coupled to a corresponding bit of the selection signal;
        a first corrector to limit saturation of each of the first accumulators;
        a second set of N accumulators, each second accumulator having an input coupled to an output of a respective first accumulator;
        a second corrector to limit saturation of each of the second accumulators;
        a set of N adders, each to combine respective outputs for each of the corresponding first and second accumulators; and
        a sorter coupled to the ADC output and an output from each adder to generate the N-bit selection signal.

10. The $\Sigma\Delta$ ADC of claim 9, wherein:
    each unit element has an input coupled to a corresponding bit of the selection signal, to generate an output signal based on its corresponding selection signal value; and
    the DAC includes an adder to combine an output of each unit element and to generate the feedback signal.

11. The $\Sigma\Delta$ ADC of claim 9, the multi-order shuffler further comprising:
    a dithering unit to apply N pseudo-randomized dithering values to each of the combined first and second accumulator output values.

12. The $\Sigma\Delta$ ADC of claim 9, the first corrector further comprising:
    an adder having inputs coupled to each first accumulator output;
    a divider having an input coupled to an output of the adder, the divider to scale the output by a predetermined first correction factor; and
    a set of N subtractors, each having inputs coupled to an output of the divider and a corresponding output of each first accumulator, wherein an output from each of the subtractors is provided to the corresponding first accumulators to determine a new first accumulator output values.

13. The $\Sigma\Delta$ ADC of claim 12, wherein the first correction factor is greater than N.

14. The $\Sigma\Delta$ ADC of claim 12, wherein the divider truncates the adder output for correction factors that correspond to a power of 2.

15. The ΣΔ ADC of claim 9, the second corrector further comprising:
- an adder having inputs coupled to each second accumulator output;
- a divider having an input coupled to an output of the adder, the divider to scale the adder output by a predetermined second correction factor;
- a set of N subtractors, each having inputs coupled to an output of the divider and a corresponding output of each second accumulator, wherein an output from each of the subtractors is provided to the corresponding second accumulators to determine a new second accumulator output values.

16. The ΣΔ ADC of claim 15, wherein the second correction factor is greater than N.

17. The ΣΔ ADC of claim 15, wherein the divider truncates the adder output for correction factors that correspond to a power of 2.

18. A non-transitory machine-readable medium having stored thereon instructions, which if performed by a processor, causes the processor to perform a method comprising:
- accumulating each of a plurality of digital-to-analog converter ("DAC") unit element selection values to generate a first accumulation values for each unit element selection value;
- limiting saturation for each first accumulation value, wherein a range for each first accumulation value is compressed while context is maintained for the range of each first accumulation value;
- accumulating each of the first accumulation values to provide a plurality of corresponding second accumulation values;
- limiting saturation for each second accumulation value, wherein a range for each second accumulation value is compressed while context is maintained for each second accumulation value; and
- combining the first and second accumulation values for each selection signal to provide updated unit element selection values.

19. The non-transitory machine readable medium of claim 18, the method further comprising dithering the updated unit element selection values.

20. The non-transitory machine readable medium of claim 18, the limiting saturation for each first accumulation value further comprising:
- summing each of the first accumulation values;
- scaling the summed first accumulation values by a predetermined first correction factor to generate a first correction value;
- subtracting, from each first accumulation value, the first correction value to generate first corrected accumulation values; and
- replacing each of a subsequent first accumulation value with the sum of the first corrected accumulation values and the corresponding selection values.

21. The non-transitory machine readable medium of claim 20, wherein the first correction factor is greater than the number of DAC unit elements.

22. The non-transitory machine readable medium of claim 20, the scaling further comprising dividing the summed first accumulation values by the first correction factor.

23. The non-transitory machine readable medium of claim 20, the scaling further comprising truncating the summed first accumulation values for a first correction factor that corresponds to a power of 2.

24. The non-transitory machine readable medium of claim 18, the limiting saturation for each second accumulation value further comprising:
- summing each of the second accumulation values;
- scaling the summed second accumulation values by a predetermined second correction factor to generate a second correction value;
- subtracting, from each second accumulation value, the second correction value to generate second corrected accumulation values; and
- replacing each of a subsequent second accumulation value with the sum of the second corrected accumulation values and the corresponding first accumulation values.

25. The non-transitory machine readable medium of claim 24, wherein the second correction factor is greater than the number of DAC unit elements.

26. The non-transitory machine readable medium of claim 24, the scaling further comprising dividing the summed second accumulation values by the second correction factor.

27. The non-transitory machine readable medium of claim 24, the scaling further comprising truncating the summed second accumulation values for a second correction factor that corresponds to a power of 2.

28. A method, comprising:
- responsive to selection signals, selecting DAC unit elements for generation of a feedback signal according to a second order modeling process that accumulates selection decisions in two cascaded accumulation stages;
- subtracting from the selection signals, input into the first accumulation stage, a first correction value corresponding to a scaled sum of the first accumulation stage outputs; and
- subtracting from the outputs of the first accumulation stage, which are input into the second accumulation stage, a second correction value corresponding to a scaled sum of the second accumulation stage outputs.

* * * * *